US009709898B2

(12) United States Patent
Wise et al.

(10) Patent No.: US 9,709,898 B2
(45) Date of Patent: Jul. 18, 2017

(54) AMPLIFICATION METHOD FOR PHOTORESIST EXPOSURE IN SEMICONDUCTOR CHIP MANUFACTURING

(71) Applicant: International Business Machines Corporation, Armonk, NY (US)

(72) Inventors: Richard S. Wise, Newburgh, NY (US); Daniel A. Corliss, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 443 days.

(21) Appl. No.: 14/521,963

(22) Filed: Oct. 23, 2014

(65) Prior Publication Data

US 2015/0042972 A1    Feb. 12, 2015

Related U.S. Application Data

(62) Division of application No. 13/735,232, filed on Jan. 7, 2013, now Pat. No. 9,104,113.

(51) Int. Cl.
*G03B 27/52* (2006.01)
*G03B 27/58* (2006.01)
*G03F 7/20* (2006.01)

(52) U.S. Cl.
CPC ........ *G03F 7/70325* (2013.01); *G03F 7/2004* (2013.01); *G03F 7/70058* (2013.01);
(Continued)

(58) Field of Classification Search
CPC .. G03F 7/2004; G03F 7/2041; G03F 7/70058; G03F 7/70033; G03F 7/70308;
(Continued)

(56) References Cited

U.S. PATENT DOCUMENTS 6,686,132 B2    2/2004 Cheng et al.
6,998,611 B2 *  2/2006 Nakasuji ............... B82Y 10/00
                                                 250/306
(Continued)

OTHER PUBLICATIONS

Glodde, M. et al., "Measurements of Acid generation by Extreme Ultraviolet Irradiation in Lithographic Filsm" J. Vac. Sci. Technol. B. (Nov./Dec. 2007) pp. 2496-2503, vol. 25, No. 6.

(Continued)

*Primary Examiner* — Christina Riddle
(74) *Attorney, Agent, or Firm* — Scully, Scott, Murphy & Presser, P.C.; Steven J. Meyers

(57) ABSTRACT

An electrical field is applied through an extreme ultraviolet (EUV) photoresist layer along a direction perpendicular to an interface between the EUV photoresist layer and an underlying layer. Secondary electrons and thermal electrons are accelerated along the direction of the electrical field, and travel with directionality before interacting with the photoresist material for a chemical reaction. The directionality increases the efficiency of electron photoacid capture, reducing the required EUV dose for exposure. Furthermore, this directionality reduces lateral diffusion of the secondary and thermal electrons, and thereby reduces blurring of the image and improves the image resolution of feature edges formed in the EUV photoresist layer. The electrical field may be generated by applying a direct current (DC) and/or alternating current (AC) bias voltage across an electrostatic chuck and a conductive plate placed over the EUV photoresist layer with a hole for passing the EUV radiation through.

18 Claims, 3 Drawing Sheets

(52) U.S. Cl.
CPC ...... *G03F 7/70308* (2013.01); *G03F 7/70375* (2013.01); *G03F 7/2041* (2013.01)

(58) Field of Classification Search
CPC .............. G03F 7/70325; G03F 7/70358; G03F 7/70375; G03F 7/70625; G03F 7/70916; G03F 7/70933; G03F 7/70941
USPC ............... 355/30, 52, 53, 55, 67–71, 72–77; 250/492.1, 492.2, 492.22, 492.23, 492.24, 250/492.3, 493.1, 503.1, 504 R, 505.1, 250/515.1; 430/5, 6, 22, 311, 319, 396
See application file for complete search history.

(56) References Cited

U.S. PATENT DOCUMENTS

| | | | |
|---|---|---|---|
| 2002/0096647 A1* | 7/2002 | Moors ................. | G03F 7/70558 250/492.1 |
| 2004/0200226 A1* | 10/2004 | Hara ....................... | F25B 21/02 62/3.2 |
| 2006/0216650 A1* | 9/2006 | Harayama ........... | G03F 7/70858 430/311 |
| 2009/0079525 A1 | 3/2009 | Sijben | |
| 2010/0068416 A1* | 3/2010 | Iosad ...................... | G03F 7/164 427/595 |
| 2010/0068659 A1* | 3/2010 | Hamaya .............. | G03F 7/70916 430/325 |
| 2013/0235357 A1 | 9/2013 | Delgado et al. | |
| 2014/0061655 A1 | 3/2014 | Hsu et al. | |
| 2014/0327894 A1* | 11/2014 | Koh ...................... | G03F 7/0002 355/53 |

OTHER PUBLICATIONS

Cho, K. et al., "EUV Resist Patterning Results for 22nm HP and Smaller" Advanced Materials Research Center (Oct. 17-20, 2010) pp. 1-27, Session 4: Resist-1.

Utsumi, T., "Shot Noise Effect on LER and Throughput in LEEPL System" Proc. SPIE 6517, Emerging Lithographic Technologies XI (Mar. 16, 2007) pp. 65172J-1-65172J-9, vol. 6517.

* cited by examiner

AMPLIFICATION METHOD FOR PHOTORESIST EXPOSURE IN SEMICONDUCTOR CHIP MANUFACTURING

BACKGROUND

The present disclosure relates to a method of exposing an extreme ultraviolet (EUV) photoresist, and an apparatus for implementing the same.

Extreme ultraviolet lithography is a lithography technology using an extreme ultraviolet (EUV) wavelength radiation for exposure. As used herein, EUV refers to a range of electromagnetic radiation having a wavelength from 10 nm to 50 nm. When an EUV photon is absorbed in a photoresist, at least one photoelectron, secondary electrons, and thermal electrons are generated by ionization. The photoelectrons are generated as a direct result of a photon-matter interaction between the EUV photon and the matter in the photoresist layer. The secondary electrons are caused by collision of the photoelectron with additional electrons as the photoelectron travels through the photoresist material. The thermal electrons are derived from the photoelectrons or the secondary electrons due to their energy loss or due to collisions that transfer energy less than about 2.5 eV.

EUV photoresist exposure (on a semiconductor wafer) is typically accomplished by generating photoelectrons within a photoresist layer. Upon generation, the photoelectrons do not have controlled directionality. As a result, feature edges defined by an EUV exposure are variable and dependent upon the path of the secondary electrons, their inelastic collisions, the resultant thermalization that ultimately drives the decomposition of the photoacid generator (PAG) within the photoresist, and the resist polymer/molecular distribution and homogeneity for reaction sites.

Thermalized electrons are estimated to have a mean free path of about 2 nm to 5 nm. Currently, the imaged feature edge roughness, as well as resolution of the minimum feature size, is insufficient for EUV lithography to be able to achieve the required performance for utilization in semiconductor manufacturing. To date, high volume semiconductor wafer exposure tooling has not had to address photoelectron directionality, as the resist exposure has been a photon induced reaction.

SUMMARY

An electrical field is applied through an extreme ultraviolet (EUV) photoresist layer along a direction perpendicular to an interface between the EUV photoresist layer and an underlying layer. Secondary electrons and thermal electrons are accelerated along the direction of the electrical field, and travel with directionality before interacting with the photoresist material for a chemical reaction. The directionality reduces lateral diffusion of the secondary and thermal electrons, and thereby reduces blurring of the image and improves the image resolution of feature edges formed in the EUV photoresist layer. The electrical field may be generated by applying a direct current (DC) and/or alternating current (AC) bias voltage across an electrostatic chuck on which a substrate with the EUV photoresist layer is mounted and a conductive plate placed over the EUV photoresist layer with a hole for passing the EUV radiation through.

According to an aspect of the present disclosure, a method of lithographically exposing an extreme ultraviolet (EUV) photoresist layer is provided. A substrate with an EUV photoresist layer thereupon is disposed on an electrically conductive chuck in a vacuum enclosure. A conductive plate with a hole therein is disposed over the EUV photoresist layer. The EUV photoresist layer is lithographically exposed by irradiating portions of the EUV photoresist layer with an EUV radiation through the hole in the conductive plate while an electrical field is applied across the conductive plate and the conductive chuck.

According to another aspect of the present disclosure, an apparatus for lithographically exposing an extreme ultraviolet (EUV) photoresist layer is provided. The apparatus includes an electrically conductive chuck configured to hold a substrate with an EUV photoresist layer thereupon and located in a vacuum enclosure, and an EUV radiation source configured to emit an EUV radiation. The apparatus further includes a conductive plate with a hole therein and located over the electrically conductive chuck. The hole is located in a beam path of the EUV radiation. The apparatus further includes an electrical bias voltage source and a set of conductive structures configured to supply an electrical bias voltage across the electrically conductive chuck and the conductive plate.

DETAILED DESCRIPTION

Figure 1:
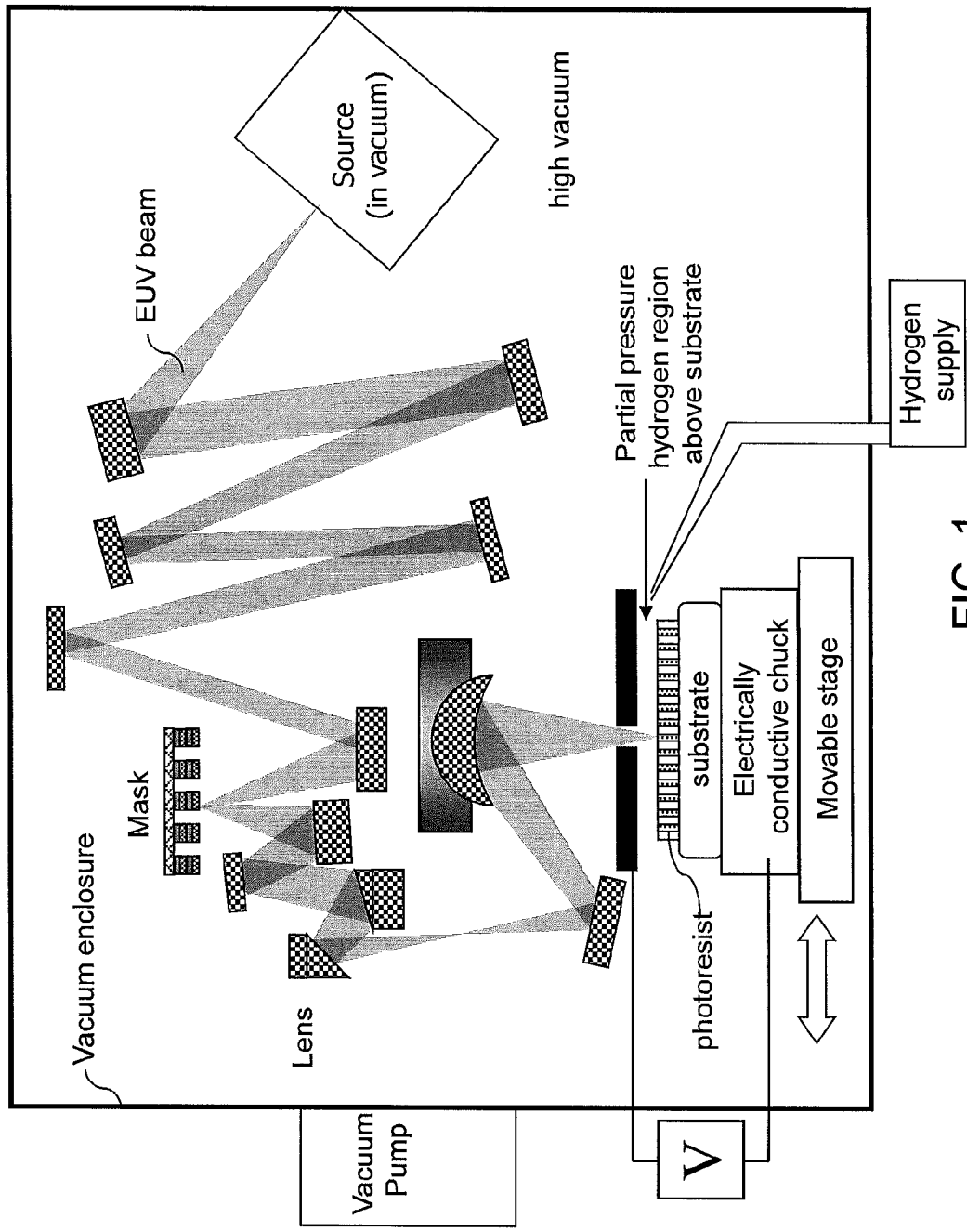
FIG. 1 is a schematic cross-sectional view of an exemplary extreme ultraviolet (EUV) lithography apparatus according to an embodiment of the present disclosure.

As stated above, the present disclosure relates to a method of exposing an extreme ultraviolet (EUV) photoresist, and an apparatus for implementing the same. Aspects of the present disclosure are now described in detail with accompanying figures. Throughout the drawings, the same reference numerals or letters are used to designate like or equivalent elements. The drawings are not necessarily drawn to scale.

During conventional extreme ultraviolet (EUV) lithography, a majority of secondary electrons is lost in non-imaging layers due to poor absorption in an imaging layer, i.e., the EUV photoresist layer. The loss of the secondary electrons in the non-imaging layers is responsible for the requirement for a high exposure dose in conventional EUV lithography tools.

According to an embodiment of the present disclosure, a direct current (DC) electrical bias, an alternating current (AC) electrical bias, or a combination of a DC electrical bias and an AC electrical bias is applied within an imaging layer of an EUV lithography system. Specifically, an electrical field in a direction normal to the interface between a substrate and an EUV photoresist layer is applied through the EUV photoresist layer to induce movement of secondary electrons within the EUV photoresist layer in regions illuminated with an EUV radiation.

An exemplary extreme ultraviolet (EUV) lithography apparatus, i.e., an exemplary EUV "scanner," which can be employed in the present disclosure, is illustrated in FIG. 1 includes a vacuum enclosure. Components of the apparatus within the vacuum enclosure include an EUV source configured to emit an EUV radiation (i.e., an "EUV beam"), a set of lenses configured to focus an EUV beam on an EUV photoresist layer applied to a top surface of a substrate, an EUV mask that includes lithographic patterns to be transferred into each lithographically exposed portion of the EUV photoresist layer, an electrically conductive chuck configured to hold the substrate, a movable stage configured to move in directions perpendicular to the portion of the EUV beam that impinges onto the EUV photoresist layer, a conductive plate with a hole therein so as to pass the portion of the EUV beam that impinges onto the EUV photoresist layer through, and means for generating and applying an electrical voltage bias across the electrostatic chuck and the conductive plate with the hole therein. As used herein, an electrically conductive chuck refers to a chuck having a conductive component configured to be electrically shorted to a substrate that is mounted thereupon.

Because the space between the EUV photoresist layer and the conductive plate is under vacuum, the electrical bias between the electrostatic chuck and the conductive plate can be applied without forming a plasma. In one embodiment, the vacuum environment within the vacuum enclosure can be high vacuum environment. As used herein, "high vacuum" environment refers to a vacuum environment in which the pressure is in a range from 100 mPa ($7.6 \times 10^{-4}$ Torr) to 100 nPa ($7.6 \times 10^{-10}$ Torr).

The electrically conductive chuck is configured to hold the substrate with an EUV photoresist layer thereupon. In one embodiment, the electrostatic chuck can be any type electrostatic chuck known in the art provided that the electrostatic chuck can be mounted onto the movable stage and is connected to an output node of the means for generating and applying the electrical voltage bias. The EUV radiation source may be any type of EUV radiation source known in the art provided that the EUV radiation source emits the EUV beam into the vacuum enclosure.

The conductive plate with the hole is located over the electrically conductive chuck. The hole in the conductive plate is located in the portion of the beam path of the EUV radiation that impinges directly onto the EUV photoresist layer (without any additional reflection at a lens). The size of the hole is selected to be greater than the lateral extent of the EUV beam that passes through the hole. Thus, the conductive plate does not block any portion of the EUV beam. In one embodiment, the lateral extent of the EUV beam at the surface of the EUV photoresist layer can be the same as the size of a semiconductor chip to be printed, and the lateral extent of the portion of the EUV beam that passes through the hole in the conductive plate can be proportionally greater than the lateral extent of the EUV beam at the surface of the EUV photoresist layer by the geometrical factor by which an image reduction takes place between the portion of the EUV beam through the hole and the portion of the EUV beam at the EUV photoresist layer. The geometrical factor can have a value greater than 1 and less than 3. In one embodiment, the lateral extent (e.g., the diameter of a circular shape or a side of a square shape or a shorter side of a rectangle) of the hole can be from 3 mm to 30 mm, although lesser and greater lateral dimensions can also be employed. In one embodiment, the conductive plate can include no more than a single hole therein for passing the EUV beam therethrough.

In one embodiment, the conductive plate can be configured to be spaced from a proximal surface of the EUV photoresist layer by a spacing in a range from 0.2 mm to 5.0 mm. As used herein, a "proximal" surface of the EUV photoresist layer refers to the surface of the EUV photoresist layer that is most proximate to the conductive plate, and is identical to the top surface of the EUV photoresist layer.

Thus, the spacing between the electrostatic chuck and the conductive plate can be set such that, upon mounting of a substrate with a photoresist layer thereupon on the electrically conductive chuck, the spacing between the top surface of the EUV photoresist layer and the bottom surface of the conductive plate can be in a range from 0.2 mm to 5.0 mm, although lesser and greater distances can also be employed. In one embodiment, the spacing between the top surface of the EUV photoresist layer and the bottom surface of the conductive plate can be in a range from 0.3 mm to 3.0 mm.

The means for generating and applying an electrical voltage bias across the electrically conductive chuck and the conductive plate can include an electrical bias voltage source (represented by a square with a symbol "V" therein in FIG. 1) and a set of conductive structures. In one embodiment, the set of conductive structures can be a set of conductive wires. The electrical bias voltage source can be configured to generate a DC voltage bias, an AC voltage bias, or a combination of a DC voltage bias and an AC voltage bias. The set of conductive structures connects a first node of the electrical bias voltage source to the conductive plate and a second node of the electrical bias voltage source to the electrically conductive chuck.

The electrical bias voltage source is configured to generate an electric field, which can be a DC electric field, an AC electric field, or a combination of a DC electric field that applies a DC bias field and an AC electric field that applies a time-varying component. The electric field can have a magnitude greater than 1 kV/cm during a time period during irradiation of the EUV radiation on the EUV photoresist layer. The time period can be 100% of the duration of the irradiation of the EUV radiation on the EUV photoresist layer, or can be a fraction of the duration of the irradiation of the EUV radiation on the EUV photoresist layer that is less than 100%. In one embodiment, this fraction can be in a range from 1% to 99%.

In one embodiment, the electrical bias voltage source can be configured to generate an electric field having a magnitude in a range from 1 kV/cm to 5 MV/cm during a time period during irradiation of the EUV radiation on the EUV photoresist layer. In another embodiment, the electrical bias voltage source can be configured to generate an electric field having a magnitude greater than 1 kV/cm, 2 kV/cm, 5 kV/cm, 10 kV/cm, 20 kV/cm, 50 kV/cm, or 100 kV/cm between the electrically conductive chuck and the conductive plate during a time period during irradiation of the EUV radiation on the EUV photoresist layer. Additionally or alternately, the electrical bias voltage source can be configured to generate an electrical field having a magnitude less than 5 MV/cm, 2 MV/cm, 1 MV/cm, 500 kV/cm, 200 kV/cm, or 100 kV/cm between the electrically conductive chuck and the conductive plate during a time period during irradiation of the EUV radiation on the EUV photoresist layer.

In one embodiment, the electrical bias voltage source can be configured to generate an electric field including a direct current (DC) electrical bias and an alternating current (AC) electric field having a peak electrical field magnitude greater than 1 kV/cm. In another embodiment, the electrical bias voltage source can be configured to generate an electric field having a peak electrical field magnitude greater than 1 kV/cm, 2 kV/cm, 5 kV/cm, 10 kV/cm, 20 kV/cm, 50 kV/cm, or 100 kV/cm between the electrically conductive chuck and the conductive plate. Additionally or alternately, the electrical bias voltage source can be configured to generate an electrical field having a peak electrical field magnitude less than 5 MV/cm, 2 MV/cm, 1 MV/cm, 500 kV/cm, 200 kV/cm, or 100 kV/cm between the electrically conductive chuck and the conductive plate.

In one embodiment, the electrical bias voltage source can be configured to generate an electric field that includes an alternating current (AC) electric field having a frequency in a range from 1 Hz to 10 GHz. In another embodiment, the electrical bias voltage source can be configured to generate an electric field having a magnitude greater than 1 Hz, 10 Hz, 100 Hz, 1 kHz, 10 kHz, 100 KHz, and 1 MHz between the electrically conductive chuck and the conductive plate. Additionally or alternately, the electrical bias voltage source can be configured to generate an electrical field having a frequency less than 10 GHz, 1 GHz, 100 MHz, 10 MHz, 1 MHz, or 100 kHz between the electrically conductive chuck and the conductive plate.

In one embodiment, the movable stage is configured to move the conductive chuck and the substrate during irradiation of the EUV radiation on the EUV photoresist layer in a direction perpendicular to a direction of propagation of a portion of the EUV radiation that impinges on the EUV photoresist layer. If the direction along which the EUV beam impinges onto the surface of the EUV substrate is along a z-direction of a Cartesian coordinate system, the movable stage can be configured to move along the x-direction and the y-direction of the Cartesian coordinate system.

The optics system in the vacuum enclosure includes various minors that are configured to focus the EUV radiation from the EUV source on the EUV photoresist layer. A mask mounting apparatus is also provided within the vacuum enclosure. The mask mounting apparatus is configured to hold an EUV lithographic mask in the path of the EUV radiation so that the EUV beam impinging on the EUV photoresist layer is patterned with a lithographic pattern, i.e., the beam of the EUV radiation impinges on the EUV photoresist layer with a lithographic pattern and cause portions of the EUV photoresist layer to be illuminated and lithographically exposed while remaining portions of the EUV photoresist layer are not illuminated.

Optionally, hydrogen or another background gas may be supplied between the top surface of the EUV photoresist layer and the conductive plate. In this case, the apparatus includes a hydrogen gas source and a hydrogen gas supply apparatus configured to supply hydrogen gas from the hydrogen gas source through a hydrogen supply tube to a region between the conductive plate and the proximal surface of the EUV photoresist layer.

Figure 2:
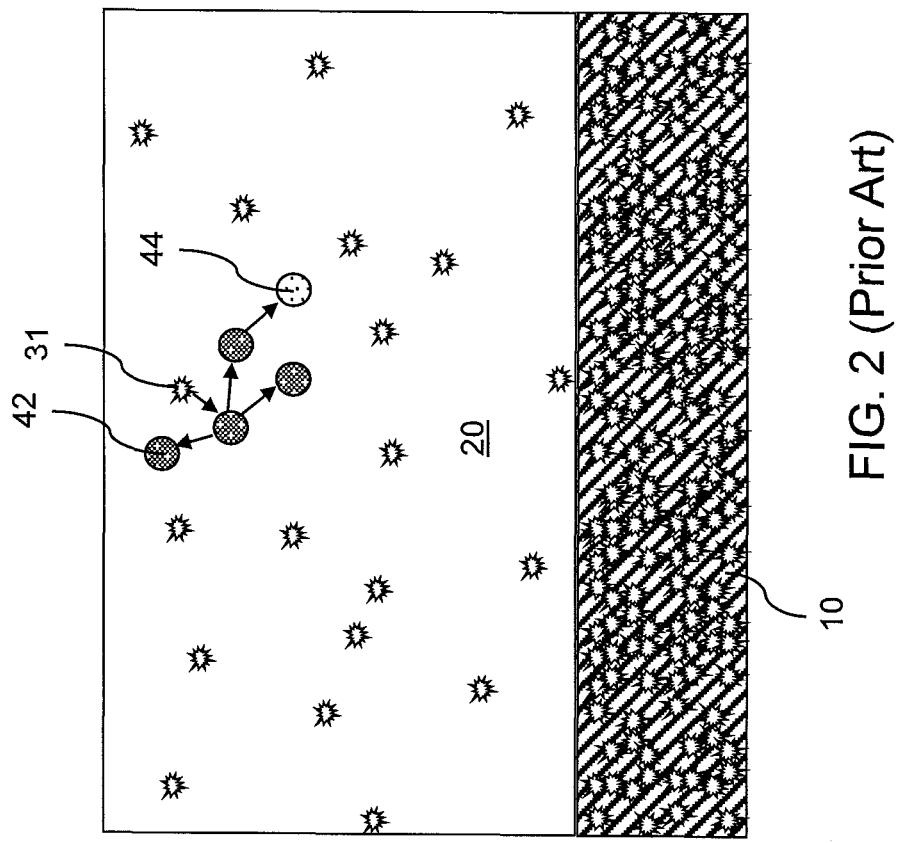
FIG. 2 is a schematic illustration of a comparative exemplary lithographic exposure process.

FIG. 2 illustrates a comparative exemplary lithographic exposure process that does not employ an electrical field in an EUV photoresist layer. In the comparative exemplary lithographic process, an EUV photoresist layer 20 is applied over a top surface of a substrate 10. An EUV beam irradiates the illustrated portion of the EUV photoresist layer 20. Because the EUV photoresist layer 20 typically has a small effective cross-sectional area for interacting with the EUV beam, a predominant portion of the EUV beam passes through the EUV photoresist layer 20 and interacts with the material in the substrate 10.

Photons of the EUV beam interacts with the material of the EUV photoresist layer 20 or the material of the substrate 10 at light-matter interaction sites to generate secondary electrons 42. The secondary electrons 42 have a lesser energy than a photon energy of the EUV beam, which can have an energy from 24.8 eV to 124 eV. The secondary electrons 42 interact with the molecules of the material of the EUV photoresist layer 20 and trigger chemical changes therein. The secondary electrons 42 gradually lose energy with each interaction with the molecules of the material of the EUV photoresist layer 20 or generation of additional secondary electrons 42. Once a secondary electron 42 loses enough energy so that the kinetic energy of the second electrons 42 falls below 2.5 eV, the secondary electron becomes a thermal electron 44, which is eventually absorbed in the EUV photoresist layer 20 or in the substrate 10.

Figure 3:
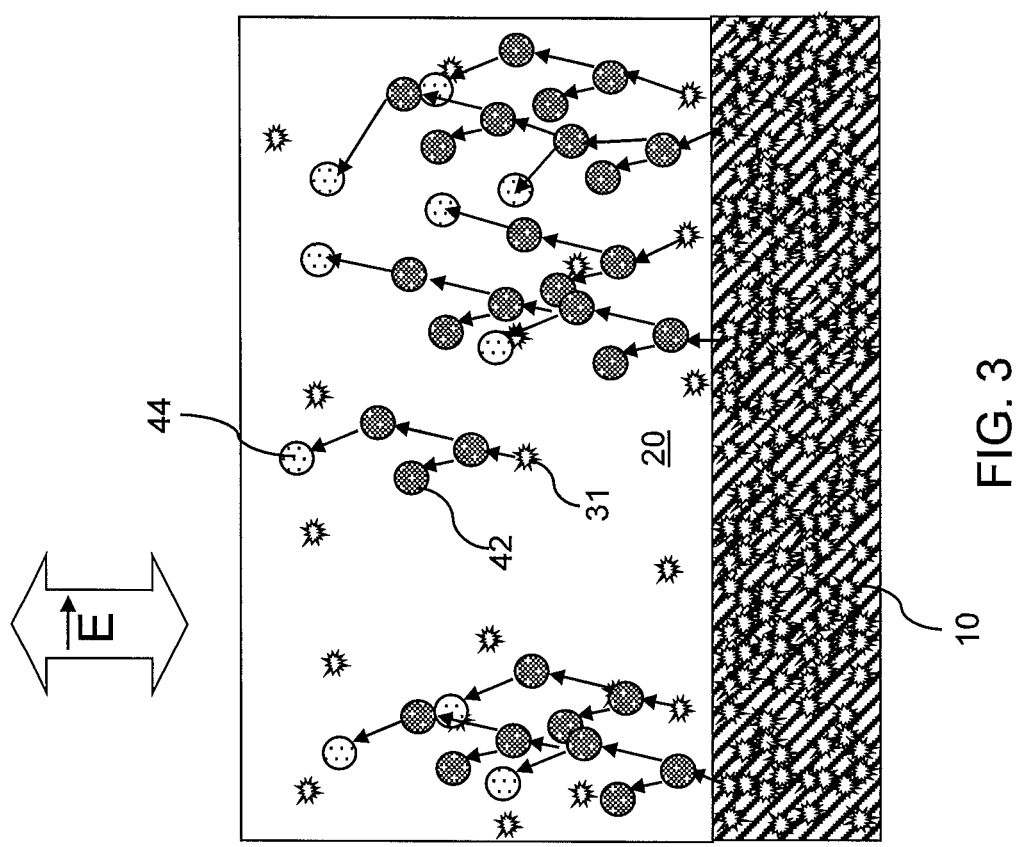
FIG. 3 is a schematic illustration of an exemplary lithographic exposure process according to an embodiment of the present disclosure.

Application of an electric field along the direction perpendicular to the interface between the substrate 10 and the EUV photoresist layer 20 alters the mechanism for movement of the secondary electrons 42 as illustrated in FIG. 3, which shows an exemplary lithographic exposure process according to an embodiment of the present disclosure.

In the exemplary lithographic exposure process, an EUV photoresist layer 20 is applied on a substrate 10, for example, by spin coating or by any other method known in the art for applying an EUV photoresist material. The substrate 10 with the EUV photoresist layer 20 thereupon is disposed upon an electrically conductive chuck in a vacuum enclosure as illustrated in FIG. 1.

A conductive plate with a hole therein is disposed over the EUV photoresist layer 20 (See FIG. 1). The EUV photoresist layer 20 is lithographically exposed by irradiating portions of the EUV photoresist layer 20 with an EUV radiation through the hole in the conductive plate while an electrical field is applied across the conductive plate and the conductive chuck. The electrical field is predominantly along the direction perpendicular to a horizontal interface between the top surface of the substrate 10 and the bottom surface of the EUV photoresist layer 20. The electrical field can be applied employing the means for generating and applying an electrical voltage bias across the electrostatic chuck and the conductive plate with the hole therein as described above. The conductive plate is spaced from a proximal surface of the EUV photoresist layer 20 by a spacing, which can be, for example, in a range from 0.2 mm to 5.0 mm as described above. Optionally, hydrogen gas may be supplied between the conductive plate and the proximal surface of the EUV photoresist layer 20.

The electrical field generated by the electrical bias voltage source can be a DC electric field, an AC electric field, or a combination of a DC electric field that applies a DC bias field and an AC electric field that applies a time-varying component. The electric field can have a magnitude greater than 1 kV/cm during a time period during irradiation of the EUV radiation on the EUV photoresist layer. The time period can be 100% of the duration of the irradiation of the EUV radiation on the EUV photoresist layer, or can be a fraction of the duration of the irradiation of the EUV radiation on the EUV photoresist layer that is less than 100%. In one embodiment, this fraction can be in a range from 1% to 99%.

In one embodiment, the electrical field generated by the electrical bias voltage source can have a magnitude in a range from 1 kV/cm to 5 MV/cm during a time period during irradiation of the EUV radiation on the EUV photoresist layer. In another embodiment, the electrical field generated by the electrical bias voltage source can have a magnitude greater than 1 kV/cm, 2 kV/cm, 5 kV/cm, 10 kV/cm, 20 kV/cm, 50 kV/cm, or 100 kV/cm between the electrically conductive chuck and the conductive plate during a time period during irradiation of the EUV radiation on the EUV photoresist layer. Additionally or alternately, the electrical field generated by the electrical bias voltage source can have a magnitude less than 5 MV/cm, 2 MV/cm, 1 MV/cm, 500 kV/cm, 200 kV/cm, or 100 kV/cm between the electrically conductive chuck and the conductive plate during a time period during irradiation of the EUV radiation on the EUV photoresist layer.

In one embodiment, the electrical field generated by the electrical bias voltage source can include a direct current (DC) electrical bias and an alternating current (AC) electric field having a peak electrical field magnitude greater than 1 kV/cm. In another embodiment, the electrical field generated by the electrical bias voltage source can have a peak electrical field magnitude greater than 1 kV/cm, 2 kV/cm, 5 kV/cm, 10 kV/cm, 20 kV/cm, 50 kV/cm, or 100 kV/cm between the electrically conductive chuck and the conductive plate. Additionally or alternately, the electrical field generated by the electrical bias voltage source can have a peak electrical field magnitude less than 5 MV/cm, 2 MV/cm, 1 MV/cm, 500 kV/cm, 200 kV/cm, or 100 kV/cm between the electrically conductive chuck and the conductive plate.

In one embodiment, the electrical field generated by the electrical bias voltage source can include an alternating current (AC) electric field having a frequency in a range from 1 Hz to 10 GHz. In another embodiment, the electrical field generated by the electrical bias voltage source can have a magnitude greater than 1 Hz, 10 Hz, 100 Hz, 1 kHz, 10 kHz, 100 KHz, and 1 MHz between the electrically conductive chuck and the conductive plate. Additionally or alternately, the electrical field generated by the electrical bias voltage source can have a frequency less than 10 GHz, 1 GHz, 100 MHz, 10 MHz, 1 MHz, or 100 kHz between the electrically conductive chuck and the conductive plate.

In one embodiment, the conductive chuck and the substrate can be moved, i.e., stepped to a next exposure site, after irradiation of the EUV radiation on the EUV photoresist layer 20 for lithographic exposure of another area of the EUV photoresist layer.

The electrical field applied between the conductive plate and the electrically conductive chuck causes the secondary electrons 42 to move along the direction of the applied electrical field. Depending on the relative magnitudes of the applied DC electrical field (if non-zero) and the applied AC electrical field (if non-zero), the net electrostatic force applied to the secondary electrons 42 may, or may not, change directions. Thus, the secondary electrons 42 may, or may not, change the direction of travel from upward to downward or vice versa.

The addition of a vertical component of a velocity vector to the secondary electrons 42 through application of the externally applied electrical field can cause reflection of normally lost secondary electrons from the substrate 10 or from above the top surface of the EUV photoresist layer 20 back into the EUV photoresist layer 20. Thus, more photoacid material within the EUV photoresist layer 20 interacts with the secondary electrons 42 and changes chemical composition due to the added vertical component of the velocity vector to the secondary electrons 42. The externally applied electrical field of embodiments of the present disclosure enables lithographic development of an EUV photoresist layer 20 employing a less lithographic exposure time for inducing sufficient chemical reaction of photoacid materials in lithographically exposed regions than the comparative exemplary lithographic exposure process illustrated in FIG. 2.

Further, the addition of a vertical component of a velocity vector to the secondary electrons 42 causes the secondary electrons to travel along vertical directions and thus, reduces the lateral straggle of the secondary electrons 42. The reduced lateral straggle of the secondary electrons 42 enables the lithographic exposure process according to embodiments of the present disclosure to generate a sharper lithographic image than the comparative exemplary lithographic exposure process illustrated in FIG. 2.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. An apparatus for lithographically exposing an extreme ultraviolet (EUV) photoresist layer, said apparatus comprising:
   an electrically conductive chuck configured to hold a substrate with an EUV photoresist layer thereupon and located in a vacuum enclosure;
   an EUV radiation source configured to emit an EUV radiation;
   a conductive plate with a hole therein and located over said electrically conductive chuck, wherein said hole is located in a beam path of said EUV radiation; and
   an electrical bias voltage source and a set of conductive structures configured to supply an electrical bias voltage across said electrically conductive chuck and said conductive plate.

2. The apparatus of claim 1, wherein said conductive plate is configured to be spaced from a proximal surface of said EUV photoresist layer by a spacing in a range from 0.2 mm to 5.0 mm.

3. The apparatus of claim 2, further comprising:
   a hydrogen gas source; and
   a hydrogen gas supply apparatus configured to supply hydrogen gas from said hydrogen gas source through a hydrogen supply tube to a region between said conductive plate and said proximal surface of said EUV photoresist layer.

4. The apparatus of claim 1, wherein said electrical bias voltage source is configured to generate an electric field along a direct perpendicular to a horizontal interface between a top surface of said substrate and a bottom surface of said EUV photoresist layer during a time period during irradiation of said EUV radiation on said EUV photoresist layer.

5. The apparatus of claim 4, wherein said electric field includes a direct current (DC) electric field having a magnitude greater than 1 kV/cm.

6. The apparatus of claim 5, wherein said magnitude is in a range from 10 kV/cm to 1 MV/cm.

7. The apparatus of claim 4, wherein said electric field includes an alternating current (AC) electric field having a frequency greater than 1 Hz.

8. The apparatus of claim 7, wherein said frequency is in a range from 1 kHz to 100 MHz.

9. The apparatus of claim 4, wherein said electric field includes a combination of a DC electrical field and an AC electric field having a peak electrical field magnitude greater than 1 kV/cm.

10. The apparatus of claim 4, wherein said time period of applying said electric field has a value no greater than that of said irradiation of said EUV radiation on said EUV photoresist layer.

11. The apparatus of claim 1, wherein said vacuum enclosure provides a high vacuum environment having a pressure ranging from 100 mPa to 100 nPa.

12. The apparatus of claim 1, wherein a lateral extent of said hole in said conductive plate is greater than a lateral extent of said beam of said EUV radiation.

13. The apparatus of claim 12, wherein said lateral extent of said hole in said conductive plate ranges from 3 mm to 30 mm.

14. The apparatus of claim 1, wherein said set of conductive structures comprises a set of conductive wires.

15. The apparatus of claim 1, further comprising a movable stage configured to move said conductive chuck and said substrate during irradiation of said EUV radiation on said EUV photoresist layer in a direction perpendicular to a direction of propagation of a portion of said EUV radiation that impinges on said EUV photoresist layer.

16. The apparatus of claim 1, further comprising:
an optics system configured to focus said EUV radiation on said EUV photoresist layer; and
a mask mounting apparatus configured to hold an EUV lithographic mask in a path of said EUV radiation.

17. The apparatus of claim 16, wherein said EUV lithographic mask comprises lithographic patterns to be transferred into said EUV photoresist layer.

18. The apparatus of claim 16, wherein said optics system comprises a set of lenses.

* * * * *